(12) United States Patent
Sato et al.

(10) Patent No.: US 9,312,162 B2
(45) Date of Patent: Apr. 12, 2016

(54) DICING SHEET AND A PRODUCTION METHOD OF A SEMICONDUCTOR CHIP

(71) Applicant: LINTEC Corporation, Tokyo (JP)

(72) Inventors: Yosuke Sato, Tokyo (JP); Michio Kanai, Tokyo (JP); Hayato Nakanishi, Tokyo (JP)

(73) Assignee: LINTEC Corporation, Tokyo (JP)

( * ) Notice: Subject to any disclaimer, the term of this patent is extended or adjusted under 35 U.S.C. 154(b) by 645 days.

(21) Appl. No.: 13/665,972

(22) Filed: Nov. 1, 2012

(65) Prior Publication Data

US 2013/0133938 A1    May 30, 2013

(30) Foreign Application Priority Data

Nov. 2, 2011    (JP) .................................. 2011-241020

(51) Int. Cl.
| | |
|---|---|
| H01L 21/683 | (2006.01) |
| H01L 21/78 | (2006.01) |
| H05K 1/02 | (2006.01) |
| H05K 1/11 | (2006.01) |

(52) U.S. Cl.
CPC ............ *H01L 21/6836* (2013.01); *H01L 21/78* (2013.01); *H05K 1/02* (2013.01); *H05K 1/115* (2013.01); *H01L 2221/68327* (2013.01); *H01L 2221/68336* (2013.01); *H01L 2221/68381* (2013.01); *Y10T 428/24942* (2015.01)

(58) Field of Classification Search
None
See application file for complete search history.

(56) References Cited

U.S. PATENT DOCUMENTS

| | | | |
|---|---|---|---|
| 8,106,522 B2 | 1/2012 | Sato et al. | |
| 8,674,349 B2 | 3/2014 | Shinoda et al. | |
| 2003/0064579 A1 | 4/2003 | Miyakawa et al. | |
| 2011/0030881 A1* | 2/2011 | Sasaki et al. ................... | 156/153 |
| 2011/0030882 A1* | 2/2011 | Mizuno et al. ................. | 156/153 |
| 2011/0073975 A1 | 3/2011 | Mukaida | |

FOREIGN PATENT DOCUMENTS

| | | |
|---|---|---|
| JP | 2002141309 A | 5/2002 |
| JP | 2004331743 A | 11/2004 |
| JP | 2005005312 A | 1/2005 |
| JP | 2006202926 A | 8/2006 |
| JP | 2010135494 A | 6/2010 |

OTHER PUBLICATIONS

English Abstract of JP 2002141309, dated May 17, 2002.

(Continued)

*Primary Examiner* — Alexander Ghyka
(74) *Attorney, Agent, or Firm* — Cahn & Samuels, LLP

(57) ABSTRACT

A dicing sheet includes a base, an intermediate layer on one face of the base, and an pressure sensitive adhesive layer provided on the intermediate layer and having the thickness of 8 to 30 μm. The pressure sensitive adhesive layer includes a compound having an energy ray curable double bond in a molecule, and a storage elasticity G' at 23° C. of the pressure sensitive adhesive layer before curing is larger than 4 times of a storage elasticity at 23° C. of the intermediate layer. When the dicing sheet is laminated via the adhesive sheet on a wafer formed with a cylinder shape electrodes having a height of 15 μm and a diameter of 15 μm at a pitch of 40 μm having 3 rows 3 columns in equal spacing, at a center of the electrode of the cylinder shape electrodes formed in 3 rows 3 columns, the pressure sensitive adhesive layer does not contact at a part of a height of 7.5 μm or less of the electrode.

12 Claims, 3 Drawing Sheets

(56) References Cited

OTHER PUBLICATIONS

English abstract of JP201013494 (A).
English abstract of JP2006202926 (A).
English Abstract of JP 2005005312.
English Abstract of JP 2004331743.

* cited by examiner

DICING SHEET AND A PRODUCTION METHOD OF A SEMICONDUCTOR CHIP

This U.S. patent application claims priority of Japanese patent document 2011-241020 filed on Nov. 2, 2011, the entirety of which is incorporated herein by reference.

TECHNICAL FIELD

The present invention relates to a dicing sheet used for fixing a semiconductor wafer when producing a semiconductor chip by separating the semiconductor wafer into each circuit. Also, the present invention relates to a production method of the semiconductor chip using said dicing sheet. Particularly, the dicing sheet of the present invention is preferably used when producing the chip by fixing the semiconductor wafer comprising a projection like electrode on the surface, such as the semiconductor wafer comprising so called through-silicon via (TSV), then by cutting.

BACKGROUND OF THE INVENTION

After the circuit is formed on the surface, the semiconductor wafer is carried out with a grinding on the back face side of the wafer, thereby the back side grinding step which controls the wafer thickness, and the dicing step separating the wafer into predetermined size are carried out. Also, following the back side grinding step, the process treatment accompanying the heat generation such as the etching treatment, or the treatment carried out at a high temperature such as the vapor deposition of the metal film to the back side may be carried out. The semiconductor wafer being separated into the chip size (the semiconductor chip) is picked up and transferred to the next step.

Recently, along with the wide spread of the IC card, the semiconductor chip which is the constitution member of the IC card has been made thinner. Thus, the wafer which conventionally had a thickness of 350 µm or so is demanded to be as thin as 50 to 100 µm or less.

Also, in accordance with having a larger capacity and a higher performance of electronic circuit, layered circuit which the plurality of chips are layered three dimensionally are being developed. In such layered circuit, conventionally the electrical conductivity connection of the semiconductor were generally carried out by wire bonding, however due to the needs of recent years to make further compact and to have higher performances, the effective means without using the wire bonding is developed which is the method of providing electrodes (through-silicon via) penetrating through from the circuit formed face to the back side of the semiconductor chip thereby electrically connecting the chips on the top and the bottom directly.

As for the production method of such chip with the through-silicon via, for example, the method of providing the through hole at the predetermined position of the semiconductor wafer by plasma or so, and after pouring the conductor such as the copper or so to this through hole, then providing the circuit and the through-silicon via by carrying out the etching or so to the semiconductor wafer surface, may be mentioned. The semiconductor wafer provided with the circuit and the through-silicon via is diced by using the dicing sheet formed with the pressure sensitive adhesive layer on the base film, thereby the chip with the through-silicon via which is separated is obtained.

During the dicing step for obtaining the above described chip with the through-silicon via, the method is proposed in which the adhesive sheet formed on the base film is deformed by being pressed against the through-silicon via projecting out from the laminating face, and by embedding the electrode into the dented part of the pressure sensitive adhesive layer having roughly the same shape as the projecting part of the electrode, the semiconductor wafer formed with the through-silicon via is laminate/fixed to the dicing sheet, then carrying out the dicing to obtain the separated chip (Patent Articles 1 and 2). However, the dicing sheet recited in the Patent Articles 1 and 2, the pressure sensitive adhesive layer embeds the through-silicon via, thus the residue of the pressure sensitive adhesive layer may remain in between the through-silicon vias. Due to said residue, the chip surface is contaminated, and the reliability of the semiconductor chip may decline. The patent articles 1 and 2 proposes the means for reducing such remaining residues, however it did not necessarily completely eliminate the possibility of the remaining residues. Also, in the dicing sheet described in the patent articles 1 and 2, it is necessary to low regulate the elasticity during the dicing in order to embed the through-silicon via. Thus, it also had a problem that the chipping easily occurred due to the vibration during the dicing.

PRIOR ART DOCUMENTS

[Patent Article 1] JP Patent Application Laid Open No. 2006-202926
[Patent Article 2] JP Patent Application Laid Open No. 2010-135494

SUMMARY OF THE INVENTION

The object of the present invention is to solve the above mentioned problems of the conventional arts. That is, the object of the invention is to provide a dicing sheet capable of dicing and picking up without breaking the chip and without the remaining of the residue of the pressure sensitive adhesive layer residue in between the projection like electrodes (through-silicon via).

A subject of the present invention aiming to solve the above mentioned problems is as follows.

[1] A dicing sheet comprising a base, an intermediate layer on one face of said base, and an pressure sensitive adhesive layer provided on the intermediate layer and having the thickness of 8 to 30 µm, wherein the pressure sensitive adhesive layer comprises a compound having an energy ray curable double bond in a molecule, and a storage elasticity G' at 23° C. of the pressure sensitive adhesive layer before curing is larger than 4 times of a storage elasticity at 23° C. of the intermediate layer, and when the dicing sheet is laminated via the adhesive layer on a wafer formed with a cylinder shape electrodes having a height of 15 µm and a diameter of 15 µm at a pitch of 40 µm having 3 rows 3 columns in equal spacing, at a center of the electrode of the cylinder shape electrodes formed in 3 rows 3 columns, the pressure sensitive adhesive layer does not contact at a part of a height of 7.5 µm or less of the electrode.

[2] The dicing sheet as set forth in [1] wherein said compound having the energy ray curable double bond in the molecule includes an energy ray curable adhesive polymer having an energy ray polymerizable group bonding at a main chain or a side chain of the polymer.

[3] The dicing sheet as set forth in [1] or [2] wherein the storage elasticity at 23° C. of the intermediate layer is $10^4$ Pa or more and less than $10^5$ Pa.

[4] The dicing sheet as set forth in any one of [1] to [3] wherein the storage elasticity G' at 23° C. of the pressure sensitive adhesive layer before curing is $3 \times 10^5$ Pa or more.

[5] The dicing sheet as set forth in any one of [1] to [4] wherein said pressure sensitive adhesive layer comprises an acrylic polymer having a reactive functional group and a crosslinking agent, and comprises 5 parts by weight or more of said crosslinking agent with respect to 100 parts by weight of said acrylic polymer.

[6] The dicing sheet as set forth in [5] wherein said crosslinking agent is an isocyanate crosslinking agent.

[7] The dicing sheet as set forth in any one of [1] to [6] wherein said dicing sheet is laminated to the wafer provided with projection like electrodes.

[8] The dicing sheet as set forth in [7] wherein said projection like electrodes are through-silicon vias.

[9] The dicing sheet as set forth in [7] or [8] wherein the intermediate layer has a thickness of 0.5 to 1.5 times of a height of the projection like electrodes.

[10] A production method of a semiconductor chip comprising steps of;

laminating a dicing sheet as set forth in any one of [1] to [9] to a face formed with electrodes of a semiconductor wafer having a projection like electrodes, making a semiconductor chip by separating said semiconductor wafer into each circuit, and picking up said semiconductor chip.

The dicing sheet according to the present invention does not allow the pressure sensitive adhesive layer to follow between the projection like electrodes when laminating to the semiconductor wafer, but follows the outer peripheral part of the area where the projection like electrode is formed (the electrode formed area). As a result, the residue of the pressure sensitive adhesive layer does not remain in between the projection like electrodes, and the residue remaining at the outer peripheral part of the electrode forming area caused by polymerization malfunction can also be suppressed. Also, the pressure sensitive adhesive layer is laminated to the semiconductor wafer at the outer peripheral part of the electrode forming area, and as the pressure sensitive adhesive layer is not over softened, it prevents the water intrusion during the dicing, has good dicing property, and prevents the chipping. Also, by energy ray curing the pressure sensitive adhesive layer, the adhesive force thereof can be regulated, therefore the pickup of the chip can be easy and also the chip is prevented from being broken.

DETAILED DESCRIPTION OF INVENTION

Figure 1:
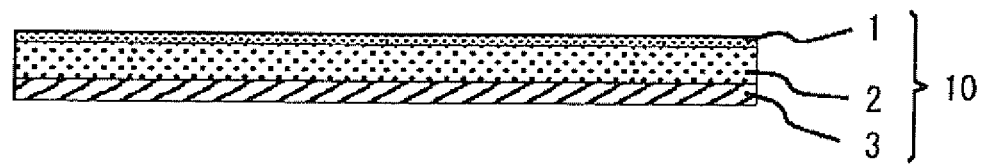
FIG. 1 is a schematic cross section of the dicing sheet according to the present invention.

Hereinafter, the dicing sheet according to the present invention will be described in detail. As shown in FIG. 1, a dicing sheet 10 according to the present invention comprises a base 3, an intermediate layer 2 provided at one side of the base 3, and an pressure sensitive adhesive layer 1 provided on said intermediate layer 2.

(The Pressure Sensitive Adhesive Layer 1)

The storage elasticity G' at 23° C. before curing (before energy ray irradiation) of the pressure sensitive adhesive layer is larger than 4 times of the storage elasticity G' at 23° C. of the intermediate layer, and preferably it is larger than 5 times of the storage elasticity G' at 23° C. of the intermediate layer. By having an pressure sensitive adhesive layer with relatively high elasticity so that it covers such intermediate layer 2 having low elasticity, the pressure sensitive adhesive layer is suitably suppressed from following in between the projection like electrodes, and prevents the generation of the residues of the pressure sensitive adhesive layer at between the projection like electrodes and the breaking of the chip during the pickup. Also, in the layered body of the pressure sensitive adhesive layer and the intermediate layer, the pressure sensitive adhesive layer reinforces the low elasticity of the intermediate layer, when compared to the case that only one layer of the low elasticity layer is present, the vibration of the wafer during the dicing is suppressed and the chipping becomes less likely to happen. The storage elasticity G' at 23° C. before curing of the pressure sensitive adhesive layer is specifically preferably $3 \times 10^5$ Pa or more, and more preferably $3.5 \times 10^5$ Pa~$1 \times 10^7$ Pa. By setting the storage elasticity G' at 23° C. before curing of the pressure sensitive adhesive layer within the above mentioned range, the effect of suppressing the following of the pressure sensitive adhesives to between the projection like electrodes can be obtained further surely.

The thickness of the pressure sensitive adhesive layer is within the range of 8 to 30 μm, and further preferably 8 to 25 μm. By having the thickness of the pressure sensitive adhesive layer within the above mentioned range, the dicing property improves and suppresses the chipping. Also, the pressure sensitive adhesive layer is suitably suppressed from following in between the projection like electrodes, thus the occurrence of the residue of the pressure sensitive adhesive layer between the projection like electrodes and the breaking of the chip during the pickup can be prevented, and the following property of the dicing sheet at the outer peripheral part of the area formed with the projection like electrodes (the electrode formed area) which will be described in below is maintained.

The pressure sensitive adhesive layer comprises the component (hereinafter, it may be described as "energy ray curable adhesive component") including the compound having an energy ray curable double bond in the molecule, and the substance exhibiting an adhesive property.

The pressure sensitive adhesive layer is formed by using the adhesive composition blended with the energy ray curable adhesive component and the photopolymerization initiator if needed. Further, in the above mentioned adhesive composition, other components may be included depending on needs in order to improve various physical properties. As for other components, the crosslinking agent is preferable.

Hereinafter, the energy ray curable adhesive component will be specifically described taking the acrylic adhesive agent as an example.

The acrylic adhesive agent comprises an acrylic polymer (A) in order to provide a sufficient adhesiveness and the film forming property to the adhesive composition, and an energy ray curable compound (B). The energy ray curable compound (B) includes the energy ray polymerizable group, and polymerize cures by receiving the irradiation of the energy ray such as ultraviolet ray, electron beam or so, thereby it comprises the function to lower the adhesive force of the adhesive composition. Also, as for those having the properties of above mentioned components (A) and (B), it is preferable to use the energy ray curable adhesive polymer (hereinafter it may be referred as component (AB)) having the energy ray polymerizable group bonded to the main chain or the side chain. Such energy ray curable adhesive polymer (AB) comprises both properties of the adhesiveness and the energy ray curable property.

As for the acrylic polymer (A), the conventionally known acrylic polymer may be used. The weight average molecular weight (Mw) of the acrylic polymer (A) is preferably 10000 to 2000000, and more preferably 100000 to 1500000. Also, the glass transition temperature (Tg) of the acrylic polymer (A) is preferably −70 to 30° C., and more preferably −60 to 20° C.

As for the monomer constituting the acrylic polymer (A), (meth)acrylate monomer or the derivatives thereof may be mentioned. Specifically, alkyl(meth)acrylate having the alkyl group of carbon atoms of 1 to 18 such as methyl(meth)acrylate, ethyl(meth)acrylate, propyl(meth)acrylate, butyl(meth)acrylate, 2-ethylhexyl(meth)acrylate or so; (meth)acrylate comprising a cyclic back bone such as cycloalkyl(meth)acrylate, benzyl(meth)acrylate, isobornyl(meth)acrylate, dicyclopentanyl(meth)acrylate, dicyclopentenyl(meth)acrylate, dicyclopentenyloxyethyl(meth)acrylate, imide(meth)acrylate or so; hydroxyl group comprising (meth)acrylate such as hydroxymethyl(meth)acrylate, 2-hydroxyethyl(meth)acrylate, 2-hydroxypropyl(meth)acrylate or so; acrylic acid, methacrylic acid, itaconic acid, glycidyl acrylate, glycidyl methacrylate or so may be mentioned.

Also, vinyl acetate, acrylonitrile, styrene or so may be copolymerized. These may be used alone or by mixing two or more thereof.

Also, the acrylic polymer (A) of the present invention preferably comprises the reactive functional group. The reactive functional group forms a three dimensional net structure by reacting with the reactive functional group of the crosslinking agent added preferably to the adhesive composition constituting the pressure sensitive adhesive layer of the present invention; thereby the storage elasticity G' at 23° C. of the pressure sensitive adhesive layer becomes easy to regulate within the predetermined range. As for the reactive functional group of the acrylic polymer (A), carboxyl group, amino group, epoxy group, hydroxyl group or so may be mentioned, however the hydroxyl group is preferable as it easily react with the crosslinking agent selectively. The reactive functional group can be introduced into the acrylic polymer (A) by constituting the acrylic polymer (A) using the monomer comprising the above mentioned reactive functional group such as the acrylic acid or the hydroxyl group containing (meth)acrylate or so.

The acrylic polymer (A) preferably includes 5 to 30 wt %, more preferably 10 to 25 wt % of the monomer comprising the reactive functional group within the entire monomer constituting the acrylic polymer (A). By setting the blending ratio of the monomer comprising the reactive functional group within such range, the acrylic polymer (A) is efficiently crosslinked by the crosslinking agent; thereby the storage elasticity G' at 23° C. of the pressure sensitive adhesive layer becomes easy to regulate within the predetermined range. Also, the reactive functional group (for example of hydroxyl group) equivalent amount of the acrylic polymer (A) is preferably 0.17 to 2.0 times of the reactive functional group (for example of the isocyanate functional group) of the crosslinking agent equivalent amount. By setting the relation between the reactive functional group equivalent amount of the acrylic polymer (A) and the reactive functional group equivalent amount of the crosslinking agent within the above mentioned range, the storage elasticity G' at 23° C. of the pressure sensitive adhesive layer becomes easy to regulate within the predetermined range.

The energy ray curable compound (B) is a compound which polymerizes and cures by receiving the energy ray irradiation such as the ultraviolet ray or electron beam or so. As for the example of this energy ray curable compound, the low molecular weight compound (monomer or oligomer of monofunctional or polyfunctional) comprising the energy ray polymerizable group may be mentioned, and specifically acrylates such as trimethylolpropane triacrylate, tetramethylolmethane tetraacrylate, pentaerythritol triacrylate, dipentaerythritol monohydroxy pentaacrylate, dipentaerythritol hexaacrylate, 1,4-butyleneglycoldiacrylate, 1,6-hexanedioldiacrylate or so; cyclic aliphatic back bone containing acrylate such as dicyclopentadienedimethoxydiacrylate, isobornylacrylate or so; and the acrylic compound such as polyethyleneglycoldiacrylate, oligoester acrylate, urethane acrylate oligomer, epoxy modified acrylate, polyether acrylate, itaconic acid oligomer or so may be mentioned. Such compound comprises the energy ray curable double bond in the molecule, and usually the molecular weight is 100 to 30000, and more preferably 300 to 10000 or so.

In general, with respect to 100 parts by weight of the component (A) (including the energy ray curable adhesive polymer (AB) which will be described in below), the low molecular weight compound having energy ray polymerizable group is used in the ratio of preferably 0 to 200 parts by weight, more preferably 1 to 100 parts by weight, and further preferably 1 to 30 parts by weight. The low molecular weight compound comprising the energy ray polymerizable group, due to its low molecular weight, softens the pressure sensitive adhesive layer of before the energy ray curing by adding it. In such case, the effect of the present invention may not be obtained sufficiently which is to makes it difficult to follow in between the projection like electrodes described for the pressure sensitive adhesive layer in below. Therefore it is preferable to control the used amount of the low molecular weight compound comprising the energy ray polymerizable group to low amount.

The energy ray curable adhesive polymer (AB) comprising the properties of both the above mentioned component (A) and (B) has the energy ray polymerizable group bonded to the main chain or the side chain of the polymer. As mentioned in the above, it is preferable to control the used amount of the low molecular weight compound having the energy ray polymerizable group to low amount; however in this case, the curing of the pressure sensitive adhesive layer by the energy ray irradiation may be insufficient, thereby causing the effect to suppress the residue to the adherent of the pressure sensitive adhesive layer may be lowered. Thus, by applying the energy ray curable adhesive polymer (AB) to the pressure sensitive adhesive layer, the curing of the pressure sensitive adhesive layer can be sufficiently carried out by the energy ray irradiation without softening the pressure sensitive adhesive layer of before the energy ray irradiation.

Also, the energy ray curable adhesive polymer (AB) comprised the energy ray polymerizable group in the molecule and also it is can comprise the reactive functional group; thus it has high possibility that one molecule binds with other molecule. Therefore, after curing the pressure sensitive adhesive layer by irradiating the energy ray, it is very unlikely that the low molecular weight component remains without being taken into the three dimensional net structure. Therefore, the residue caused by the remaining low molecular weight component without being taken into the three dimensional net structure is suppressed from being generated.

The main back bone of the energy ray curable adhesive polymer is not particularly limited, and it may be an acrylic polymer commonly used as the pressure sensitive adhesive layer.

The energy ray polymerizable group bonded to the main chain or the side chain of the energy ray curable adhesive polymer is for example the group including the carbon-carbon double bond of the energy ray curable property, and specifically (meth)acryloyl group or so may be mentioned. The energy ray polymerizable group may be bonded with the energy ray curable adhesive polymer via alkylene group, alkyleneoxy group, polyalkyleneoxy group.

The weight average molecular weight (Mw) of the energy ray curable adhesive polymer (AB) bonded with the energy ray polymerizable group is preferably 10000 to 2000000, and more preferably 100000 to 1500000. Also, the glass transition temperature (Tg) of the energy ray curable adhesive polymer (AB) is preferably −70 to 30° C., and more preferably −60 to 20° C.

The energy ray curable polymer (AB) is for example obtained by reacting the acrylic adhesive polymer comprising a functional group such as hydroxyl group, carboxyl group, amino group, substituted amino group, epoxy group or so, and the polymerizable group containing compound having 1 to 5 energy ray polymerizable carbon-carbon double bond in every other molecule which reacts with said functional group. The acrylic adhesive polymer is preferably a copolymer formed by (meth)acrylate monomer comprising a functional group such as hydroxyl group, carboxyl group, amino group, substituted amino group, epoxy group or so or the derivative thereof, and the monomer constituting the above mentioned component (A). As for said polymerizable group containing compound, (meth)acryloyl oxyethylisocyanate, meta-isopropenyl-α,α-dimethylbenzylisocyanate, (meth)acryloyl isocyanate, allylisocyanate, glycidyl(meth)acrylate; (meth)acrylic acid or so may be mentioned.

The acrylic polymer (A) and the energy ray curable compound (B) as mentioned in above, or the acrylic adhesive agent including the energy ray curable adhesive polymer (AB) is cured by energy ray irradiation. As for the energy ray, specifically ultraviolet ray, electron beam or so may be used.

As for the photopolymerization initiator, a photoinitiator such as benzoin compounds, acetophenone compound, acylphosphine oxide compound, titanocene compound, thioxanthone compound, peroxide compound or so; photosensitizer of amine or quinone or so may be mentioned. Specifically, 1-hydroxycyclohexylphenyl ketone, benzoin, benzoin methylether, benzoin ethylether, benzoin isopropylether, benzyl diphenylsulfide, tetramethylthiurammonosulfide, azobisisobutylonitrile, dibenzyl, diacetyl, β-chloroanthraquinone, 2,4,6-trimethylbenzoyldiphenylphosphinoxide or so may be mentioned as examples. In case of using the ultra violet ray as the energy ray, the irradiation time, irradiation amount can be made less by blending the photopolymerization initiator.

The content of the photopolymerization initiator should theoretically be determined based on the unsaturated bonding amount (the energy ray curable double bond amount) present in the pressure sensitive adhesive layer or by the reactivity thereof and the reactivity of the photopolymerization initiator used, however it is not necessarily easy in case of the complicated mixed compounds. As for general standard, the content of the photopolymerization initiator is preferably 0.1 to 10 parts by weight, more preferably 1 to 5 parts by weight with respect to 100 parts by weight of energy ray curable compound (B). When the content of the photopolymerization initiator is less than the above mentioned range, a sufficient pickup property may not be obtained due to the insufficient photopolymerization, and when it exceed the above mentioned range, the residues which does not contribute to the photopolymerization are generated, and the curing property of the pressure sensitive adhesive layer may become insufficient.

As for the crosslinking agent, organic polyvalent isocyanate compound, organic polyvalent epoxy compound, organic polyvalent imine compound or so may be mentioned, and preferably it is organic polyvalent isocyanate compound (the isocyanate crosslinking agent).

As for the organic polyvalent isocyanate compound, aromatic polyvalent isocyanate compound, aliphatic polyvalent isocyanate compound, alicyclic polyvalent isocyanate compound and the trimmers of organic polyvalent isocyanate compound thereof, further also a terminal isocyanate urethane prepolymer obtained by reacting these organic polyvalent isocyanate compound with the polyol compound, may be mentioned.

As for further specific examples of the organic polyvalent isocyanate compound, 2,4-tolylenediisocyanate, 2,6-tolylenediisocyanate, 1,3-xylenediisocyanate, 1,4-xylenediisocyanate, diphenylmethane-4,4'-diisocyanate, diphenylmethane-2,4'-diisocyanate, 3-methyldiphenylmethanediisocyanate, hexamethylenediisocyanate, isophoronediisocyanate, dicyclohexylmethane-4,4'diisocyanate, dicyclohexylmethane-2,4'-diisocyanate, trimethylolpropane adduct tolylenediisocyanate and lysine isocyanate or so may be mentioned.

As for specific examples of the organic polyvalent epoxy compound, 1,3-bis(N,N'-diglycidylaminomethyl)cyclohexane, N,N,N',N'-tetraglycidyl-m-xylylenediamine, ethyleneglycoldiglycidylether, 1,6-hexanedioldiglycidylether, trimethylolpropanediglycidylether, diglycidylaniline, diglycidylamine or so may be mentioned.

As for the specific examples of the organic polyvalent imine compounds, N,N'-diphenylmethane-4,4'-bis(1-aziridinecarboxyamide), trimethylolpropane-tri-β-aziridinylpropionate, tetramethylolmethane-tri-β-aziridinylpropionate, and N,N'-toluene-2,4-bis(1-aziridinecarboxyamide)triethylene melamine or so may be mentioned.

The crosslinking agent is used in the ratio of preferably 5 parts by weight or more, more preferably 8 to 35 parts by weight, and further preferably 12 to 30 parts by weight with respect to 100 parts by weight of the acrylic polymer (A) (including the energy ray curable adhesive polymer (AB)). By setting the blending amount of the crosslinking agent within the above mentioned range, the storage elasticity G' at 23° C. of the pressure sensitive adhesive layer can be easily controlled within the preferable range.

Also, as other component, other than the crosslinking agent, a dye, a pigment, an antidegradant, an antistatic agent, a flame retardant, a silicone compound, a chain transfer agent or so may be added.

Also, the adhesive force of the pressure sensitive adhesive layer at before the energy ray irradiation is preferably 500 mN/25 mm or more, more preferably 800 to 30000 mN/25 mm. Also, the adhesive force after the energy ray irradiation is preferably 10 to 500 mN/25 mm, and more preferably 10 to 300 mN/25 mm. By setting the adhesive force of the pressure sensitive adhesive layer within the above range, the dicing property and the pickup property are excellent.

Also, at the pressure sensitive adhesive layer, the release sheet for protecting the pressure sensitive adhesive layer may be layered before its use. The release sheet is not particularly limited, and for example those carried out with release treatment with the release agent of the long chain alkyl group containing carbamate or so of silicone or fluorine type to the film formed of resin of polyethyleneterephthalate, polypropylene, polyethylene or so, a foamed film thereof, or paper such as a glassine paper, a coat paper, a laminate paper or so may be used.

(The Intermediate Layer 2)

The intermediate layer 2 can be formed from various conventionally known pressure sensitive adhesives. As for such pressure sensitive adhesives, it is not particularly limited, and for example the pressure sensitive adhesives of rubber type, acrylic type, silicone type, polyvinylether or so are used. Also, the adhesive of the energy ray curable type, a heat foaming type, a water swelling type can be used as well. As the energy ray curable (ultraviolet ray curable, electron beam curable or so) adhesive, particularly, the ultraviolet ray curable adhesive is preferably used.

As mentioned in the above, the storage elasticity G' at 23° C. of the pressure sensitive adhesive layer before curing is larger than 4 times of the storage elasticity G', and preferably larger than 5 times of the storage elasticity G' at 23° C. of the intermediate layer. By providing the intermediate layer having lower elasticity in a predetermined rate with respect to the pressure sensitive adhesive layer in between the pressure sensitive adhesive layer and the base, the dicing sheet of the present invention has improved following property of the dicing sheet at the outer peripheral part of the electrode formed area compared to the case of providing only the pressure sensitive adhesive layer having relatively high elasticity. On the other hand, the tendency of easy following property of the pressure sensitive adhesive layer is not observed in between the projection like electrodes. This is thought to be caused because, at in between the electrodes, the pressure sensitive adhesive layer having relatively high elasticity is being stretched by being supported by the projection like electrodes, thus the force trying to maintain the shape of the pressure sensitive adhesive layer and the force of the intermediate layer trying to intrude in between the electrodes acts against each other.

When the storage elasticity G' at 23° C. of the pressure sensitive adhesive layer before curing is 4 times or less than of the storage elasticity G' at 23° C. of the intermediate layer, the following property of the dicing sheet at the outer peripheral part of the electrode formed area is lowered, and when laminating the dicing sheet of the present invention to the wafer formed with the projection like electrode, the amount of the air trapped between the wafer and the dicing sheet at the outer peripheral part of electrode formed area increases, thus a part of the activity of the energy ray curable compound or so may be lost by the oxygen in the air, and the polymerization malfunction of the pressure sensitive adhesive layer may occur during the energy ray irradiation. As a result, at the outer peripheral part of the electrode formed area may have an adhesive residue.

The storage elasticity G' at 23° C. of the intermediate layer is specifically and preferably $10^4$ Pa or more and less than $10^5$ Pa, more preferably $10^4$ to $9\times10^4$ Pa, and further preferably $10^4$ to $8\times10^4$ Pa. By controlling the storage elasticity G' at 23° C. of the intermediate layer within said range, the effect of improving the following property of the dicing sheet at the outer peripheral part of the electrode formed area can be obtained further securely.

When the storage elasticity G' at 23° C. of the intermediate layer is too low, the pressure sensitive adhesive layer may follow between the projection like electrodes and it may cause the pressure sensitive adhesive layer residue in between the projection like electrodes.

Note that, in case the intermediate layer has the property which is cured by energy ray irradiation, the storage elasticity G' at 23° C. of the intermediate layer is the storage elasticity at before the energy ray irradiation.

Also, the thickness of the intermediate layer is preferably 0.5 to 1.5 times of the height of the projection like electrode which will be described in below, and more preferably it is 1.0 to 1.5 times. The specific thickness of the intermediate layer may be selected from the above mentioned preferable range, and it may be determined by calculating the height of the projection like electrodes of the wafer being applied. By having the thickness of the intermediate layer within the above mentioned range, the non-following property of the dicing sheet at between the projection like electrodes, and the following property of the dicing sheet at the outer peripheral part of the electrode formed area are excellent, and the dicing property is improved and further the chipping is suppressed from occurring.

(The Base 3)

As for the base 3, it is not particularly limited, however for example, polyethylene film such as low density polyethylene (LDPE) film, linear chain low density polyethylene (LLDPE) film, high density polyethylene (HDPE) film or so; polypropylene film, polybutene film, polybutadiene film, polymethylpentene film, poly vinyl chloride film, vinyl chloride copolymer film, polyethyleneterephthalate film, polybutyleneterephthalate film, polyurethane film, polyimide film, ethylene vinylacetate copolymer film, ionomer resin film, ethylene(meth)acrylic acid copolymer film, ethylene(meth) acrylate copolymer film, polystyrene film, polycarbonate film, fluorine resin film, and films formed by hydrogenates or the modified body thereof may be used. Also, the crosslinked polymer film, the copolymer film thereof may be used as well. The above mentioned base may be only one, or it may be a composite film combining two or more thereof.

Also, in case of using the ultraviolet ray as the energy ray irradiated for curing the pressure sensitive adhesive layer and/or the intermediate layer, it is preferable that the base has transmittance against the ultraviolet ray. Note that, in case of using the electron beam as the energy ray, then the base does not have to have a light transmittance. In case the adherend needs to be visible, the base is preferably transparent. The base may be colored.

Also, in order to improve the adhesiveness between the intermediate layer and the top face of the base, that is the base surface provided with the intermediate layer, the corona treatment may be carried out, or the primer layer may be provided. Also, on the opposite face of the intermediate layer may be coated with various coating film. The dicing sheet according to the present invention is produced by forming the intermediate layer at the one face of the above mentioned base, and by providing the pressure sensitive adhesive layer on said intermediate layer. The thickness of the base is within the range of preferably 20 to 200 μm, more preferably 25 to 110 μm, and further preferably 50 to 90 μm. When the thickness of the base is too thick, the force acting against the bending of the base increases, and the release angle at the pickup is difficult to enlarge. Therefore, the force required for the pickup increases and the pickup property may be deteriorated. When the thickness of the base is too thin, the production of the film may become difficult depending on the material.

The method of providing the intermediate layer to the surface of the above base may be carried out by forming the intermediate layer by coating the intermediate layer composition constituting the intermediate layer on the release sheet in a predetermined thickness, and it may be transferred to the surface of the base; alternatively the intermediate layer may be formed by directly coating the intermediate layer composition to the surface of the base. The method of providing the pressure sensitive adhesive layer on the intermediate layer is as same as the method of providing the intermediate layer on the base, by using the adhesive composition. Thereby the dicing sheet according to the present invention is obtained.

Figure 2:
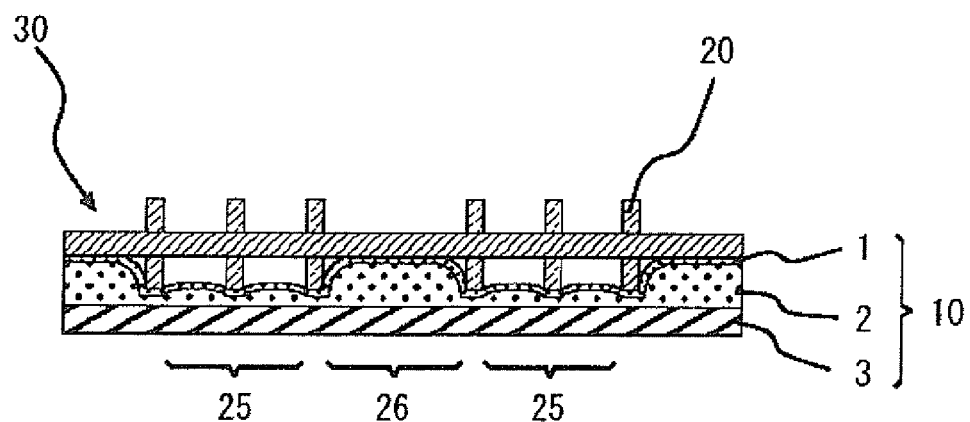
FIG. 2 is a schematic cross section showing the condition under which the dicing sheet according to the present invention is laminated to the wafer formed with the cylinder shape electrode.
Figure 3:
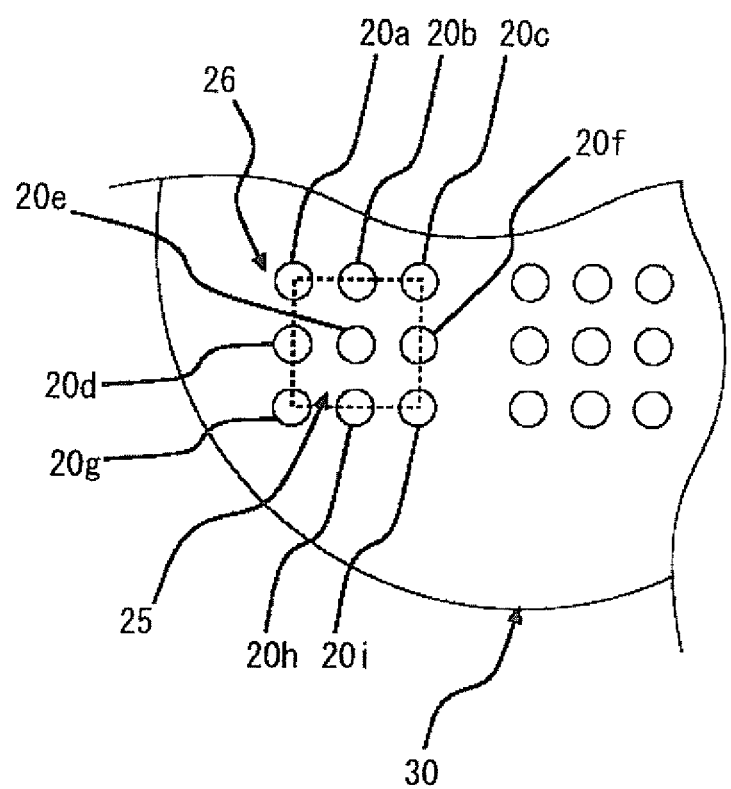
FIG. 3 shows the planner view of the circuit formed face of the semiconductor wafer formed with the cylinder shape electrode.

When the dicing sheet according to the present invention is laminated via the adhesive layer thereof on the wafer formed with the cylinder shape electrode having a height of 15 μm and a diameter of 15 μm at a pitch of 40 μm having 3 rows 3 columns in a equal spacing, at the center of the electrodes of the cylinder shape electrodes formed in 3 rows 3 columns, the pressure sensitive adhesive layer does not contact at a part of a the electrode of 7.5 μm or less. That is, as shown in FIG. 2 and FIG. 3, the dicing sheet 10 according to the present invention, at the inner peripheral part 25 (the inside of the broken line shown in FIG. 3) of the area (the electrode formed area) formed with a cylinder shape electrode having a height of 15 μm and a diameter of 15 μm at a pitch of 40 μm having 3 rows 3 columns in a equal spacing, the pressure sensitive adhesive layer 1 does not follow in between the electrodes 20, and the pressure sensitive adhesive layer 1 does not contact a part of the electrodes 20e of 7.5 μm or less. By controlling the pressure sensitive adhesive layer to not to contact the root part (the part of the electrode of 7.5 μm or less) between the electrodes of the cylinder shape electrodes having the above mentioned size and arrangement as an representative example of the projection like electrode, the effect of the present invention can be obtained which is that the pressure sensitive adhesive layer is difficult to follow between the electrodes of the projection like electrodes. Such characteristic can be controlled by the dicing sheet having a predetermined thickness of the pressure sensitive adhesive layer and the intermediate layer, and by providing a difference between the storage elasticity G' at 23° C. of the intermediate layer and the pressure sensitive adhesive layer when laminating.

Also, at the outer peripheral part 26 of the electrode formed area (the outside of the broken like shown in FIG. 3), the pressure sensitive adhesive layer 1 follows the electrode 20 and is laminated to the wafer 30. Thus, the water intrusion is prevented during the dicing, has excellent dicing property, and can prevent the chipping from happening. Also, as the pressure sensitive adhesive layer is the energy ray curable, the adhesive force can be regulated, thus the pickup of the chip is easy and also the chip is prevented from being broken.

Note that, when evaluating the above mentioned characteristic, the lamination to the wafer is carried out under the condition of 23° C., a lamination pressure of 0.3 MPa, and a lamination speed of 5 mm/sec.

The dicing sheet according to the present invention is preferably used to the face formed with the electrode of the semiconductor wafer having the projection like electrode. As for the projection like electrode, the cylinder shape electrode, a sphere electrode or so may be mentioned. The dicing sheet of the present invention can be suitably used for the wafer having a through-silicon via which is widely used particularly recently. The laminating method of the dicing sheet to the semiconductor wafer is not particularly limited.

Next, the semiconductor chip is separated into each chip using the cutting means such as dicing blade or so and thereby the semiconductor chip is produced. The depth of cut at this time is determined considering the semiconductor wafer thickness, the total thickness of the pressure sensitive adhesive layer and the intermediate layer, and the abrasion amount of the dicing blade.

After the dicing, depending on the needs, the dicing sheet according to the present invention is expanded to space apart the distance between each semiconductor chip, then the pickup of the semiconductor chip is carried out by the conventional means such as suction collet or so the semiconductor chip is produced. Also, it is preferable to carry out the expanding and the pickup after the adhesive force is lowered by irradiating the energy ray to the pressure sensitive adhesive layer.

EXAMPLE

Hereinafter, the present invention will be described in detail using the examples, however it is not limited thereto. In regards with "the following property", "the dicing property", "the pickup property", "the residue of pressure sensitive adhesive layer", and "the storage elasticity G" of the examples and the comparative examples are evaluated as described in below.

<The Following Property>

The dicing sheet was laminated (23° C., the lamination pressure 0.3 MPa, the lamination speed of 5 mm/sec) to one face of the silicon wafer (a diameter of 8 inch, a thickness of 50 μm) formed with a cylinder shape electrode (a height of 15 μm and a diameter of 15 μm) projecting out in both faces at the pitch of 40 μm having 3 rows 3 columns in equal spacing. Next, using the ultraviolet ray irradiation device (RAD-2000 m/12, made by Lintec Corporation), the ultraviolet ray was irradiated under the nitrogen atmosphere (the illumination 230 mW/cm$^2$, the luminous energy 190 mJ/cm$^2$), thereby the pressure sensitive adhesive layer was cured. After releasing the dicing sheet from the wafer, the dicing sheet was cut along the straight line connecting the center mark of the 1 row 1 column of the cylinder shape electrode (the cylinder shape electrode 20a of FIG. 3) and the center mark of the cylinder shape electrode of 3 row 3 column (the cylinder shape electrode of 20i of FIG. 3). The cut face was observed using the digital microscope, and the difference between the distance from the wafer surface to the point where the tip portion of the cylinder shape electrode was contacting, and to the point of which the pressure sensitive adhesive layer was closest to the wafer surface was obtained, and verified whether this difference was the height of 7.5 μm or less. Thereby, it was determined whether the pressure sensitive adhesive layer has contacted or not to the part of the cylinder shape electrode of the height of 7.5 μm or less.

In case the pressure sensitive adhesive layer did not follow between the cylinder shape electrodes (the case that the pressure sensitive adhesive layer is not in contact with the part of the electrode height of 7.5 μm or less), then it was evaluated "A", and if it did follow in between the cylinder shape electrode it was evaluated "B".

<The Dicing Property>

The chip was obtained by dicing the silicon wafer; then the end parts of 10 chips were observed, and when the chipping (the loss of the chip end part) of 30 μm or larger was not observed at the end part, it was evaluated "A"; when chipping of larger than 30 μm and 50 μm or less was observed it was evaluated "B"; and when a chipping of larger than 50 μm was observed it was evaluated "C". Note that, the dicing condition was as follows.

The Dicing Condition

The dicing sheet was laminated (23° C., the lamination pressure 0.3 MPa, the lamination speed of 5 mm/sec) to one face of the silicon wafer (a diameter of 8 inch, a thickness of 50 μm) formed with a cylinder shape electrode (a height of 15 μm and a diameter of 15 μm). Using the dicing device (DFD651 made by DISCO Corporation), the dicing of the silicon wafer was carried out at a cutting speed of 20 mm/min, the depth of cut into the base of the dicing sheet of 20 µm, thereby the chip (size: 5 mm×5 mm) was obtained. Note that as for the dicing blade, the dicing blade (27HECC) made by DISCO Corporation was used and the rotation speed of the blade was 40000 rpm. Also, the cylinder shape electrode was formed at a pitch of 40 µm in an equal spacing, and it was 400 per 1 mm².

<The Pickup Property>

The chip was obtained by dicing the silicon wafer, and using the ultraviolet ray irradiation device (RAD-2000 m/12, made by Lintec Corporation), the ultraviolet ray was irradiated under the nitrogen atmosphere (the illumination 230 mW/cm², the luminous energy 190 mJ/cm²). Next, the chip was picked up using the pickup device (BESTEM D02, made by Cannon Machinery Inc.). When the chip was able to be picked up, it was evaluated "A", and when the chip was unable to be picked up, it was evaluated "B". Note that, the dicing condition was as described in above.

<The Residue of Pressure Sensitive Adhesive Layer>

The surface of the chip after the pickup was observed, and verified whether there was the residue of pressure sensitive adhesive layer at the outer peripheral part of the cylinder shape electrode formed area and between the cylinder shape electrodes. If the residue was not observed it was evaluated "A"; if a slight residue was observed then it was evaluated "B", and if the residue was observed then it was evaluated "C".

<The Storage Elasticity G'>

The storage elasticity G' at 23° C. of the intermediate layer and the pressure sensitive adhesive layer before curing were measured by dynamic mechanical analysis instrument (RDAII made by Rheometric Scientific Inc.) at a frequency of 1 Hz and a torsion amount of 0.5%.

Example 1

The Production of the Adhesive Composition 100 parts by weight of the energy ray curable adhesive polymer (the weight average molecular weight: 600000) was obtained by reacting the acrylic adhesive polymer obtained by reacting the butylacrylate/methyl(meth)acrylate/2-hydroxyethylacrylate=62/10/28 (weight ratio) and 30.2 g of methacryloyloxyethylisocyanate (MOI) per 100 g of said acrylic adhesive polymer (80 mol per 100 mol of 2-hydroxyethylacrylate unit of the acrylic adhesive polymer), 3 parts by weight of photopolymerization initiator (α-hydroxycyclohexylphenylketone (IRGACURE 184 made by CIBA Speciality Chemicals)), and 8.6 parts by weight of the crosslinking agent (polyvalent isocyanate compound (CORONATE L made by NIPPON POLYURETHANE INDUSTRY Co., Ltd.) were mixed in the solvent thereby obtained the adhesive composition. Note that, weight average molecular weight is a value obtained by using a commercially available molecular weight measuring device (the product name: "HLC-8220GPC", made by TOSOH Corporation; the column product name: "TSKGel SuperHZM-M", made by TOSOH Corporation; the eluent: tetrahydrofuran) (same applies to hereinbelow as well). Also, even if the parts by weight refers to the condition of being diluted in the solvent, all the value is in terms of solid portion (same applies to hereinbelow as well).

[The Production of the Intermediate Layer Composition]

The acrylic polymer (the weight average molecular weight: 800000) was obtained by reacting butylacrylate/acrylic acid=91/9 (weight ratio). Also, to the terminal of terminal isocyanate urethane prepolymer obtained by polymerizing the polypropyreneglycol having the molecular weight of 700 calculated from the hydroxyl group and the isophoronediisocyanate, 2-hydroxypropylacrylate was reacted; thereby bifunctional urethaneacrylate oligomer having the weight average molecular weight of 4000 was obtained.

100 parts by weight of above mentioned acrylic polymer, 80 parts by weight of the bifunctional urethaneacrylate oligomer, 2.4 parts by weight of photopolymerization initiator (α-hydroxycyclohexylphenylketone (IRGACURE 184 made by CIBA Speciality Chemicals)), and 1 parts by weight of the crosslinking agent (polyvalent isocyanate compound (CORONATE L made by NIPPON POLYURETHANE INDUSTRY Co., Ltd.) were mixed in the solvent thereby obtained the intermediate layer composition.

[The Production of the Dicing Sheet]

The above mentioned intermediate layer composition was coated and dried (the drying condition: 100° C. for 1 min) on the release film (SP-PET3811(S), made by Lintec Corporation) so that the thickness after drying is 15 µm, thereby the intermediate layer formed on the release film was obtained. Next, the intermediate layer and the base (ethylene metacrylate copolymer film, 80 µm thickness) was adhered against each other, then the release film was released from the intermediate layer thereby the intermediate layer was transferred onto the base.

Also, the above mentioned adhesive composition was coated and dried (the drying condition: 100° C. for 1 min) on the release film (SP-PET3811(S), made by Lintec Corporation) so that the thickness after drying is 10 µm, thereby the pressure sensitive adhesive layer formed on the release film was obtained.

Then, the intermediate layer with the base, and the pressure sensitive adhesive layer with the release film were adhered against each other to obtain the dicing sheet, and each evaluation was carried out after removing the release film. The results are shown in Table 1.

Example 2

The dicing sheet was obtained as same as the example 1 except for making the thickness of the intermediate layer to 20 µm, and carried out each evaluation. The results are shown in Table 1.

Example 3

The dicing sheet was obtained as same as the example 1 except for using the ethylene methacrylic acid copolymer film having thickness of 60 µm as the base, and carried out each evaluation. The results are shown in Table 1.

Example 4

The dicing sheet was obtained as same as the example 3 except for making the thickness of the pressure sensitive adhesive layer to 20 µm, and carried out each evaluation. The results are shown in Table 1.

Example 5

The dicing sheet was obtained as same as the example 3 except for using the intermediate layer composition described in below and making the thickness of the intermediate layer to 20 µm, and carried out each evaluation. The results are shown in Table 1.

[The Production of the Intermediate Layer Composition]

100 parts by weight of the energy ray curable adhesive polymer (the weight average molecular weight: 600000) obtained by reacting the acrylic adhesive polymer obtained by reacting butyl acrylate/2-hydroxyethylacrylate=85/15 (weight ratio) and the 16.2 g of methacryloyloxyethyl isocyanate (MOI) per 100 g of said acrylic adhesive polymer (80 mol per 100 mol of 2-hydroxyethylacrylate unit of acrylic adhesive polymer), 3 parts by weight of photopolymerization initiator (α-hydroxycyclohexylphenylketone (IRGACURE 184 made by CIBA Speciality Chemicals)), and 0.1 parts by weight of crosslinking agent (polyvalent isocyanate compound (CORONATE L made by NIPPON POLYURETHANE INDUSTRY Co., Ltd.) were mixed in the solvent thereby obtained the intermediate layer composition.

Example 6

The dicing sheet was obtained as same as the example 3 except for using the adhesive composition described in below, and carried out each evaluation. The results are shown in Table 1.
[The Production of the Adhesive Composition]

100 parts by weight of the energy ray curable adhesive polymer (the weight average molecular weight: 550000) was obtained by reacting the acrylic adhesive polymer obtained by reacting 2-ethylhexylacrylate/vinyl acetate/2-hydroxyethylacrylate=40/40/20 (weight ratio), and 21.6 g of methacryloyl oxyethyl isocyanate (MOI) per 100 g of said acrylic adhesive polymer (80 mol per 100 mol of 2-hydroxyethylacrylate unit of acrylic adhesive polymer), 3 parts by weight of photopolymerization initiator (α-hydroxycyclohexylphenylketone (IRGACURE 184 made by CIBA Speciality Chemicals)), and 7.0 parts by weight of the crosslinking agent (polyvalent isocyanate compound (CORONATE L made by NIPPON POLYURETHANE INDUSTRY Co., Ltd.) were mixed in the solvent thereby obtained the adhesive composition.

Example 7

The dicing sheet was obtained as same as the example 6 except for making the thickness of the pressure sensitive adhesive layer to 15 μm, and carried out each evaluation. The results are shown in Table 1.

Example 8

The dicing sheet was obtained as same as the example 3 except for using the intermediate layer composition described in below, and carried out each evaluation. The results are shown in Table 1.
[The Production of the Intermediate Layer Composition]

100 parts by weight of the acrylic polymer (the weight average molecular weight: 780000) obtained by polymerizing 2-ethylhexylacrylate/2-hydroxyethylacrylate=90/10 (weight ratio) and 0.5 parts by weight of crosslinking agent ((polyvalent isocyanate compound (CORONATE L made by NIPPON POLYURETHANE INDUSTRY Co., Ltd.) were mixed in the solvent; thereby obtained the intermediate layer composition.

Example 9

The dicing sheet was obtained as same as the example 5 except for making the thickness of the intermediate layer to 25 μm, and carried out each evaluation. The results are shown in Table 1.

Example 10

The dicing sheet was obtained as same as the example 5 except for making the thickness of the intermediate layer to 10 μm, and carried out each evaluation. The results are shown in Table 1.

Comparative Example 1

The dicing sheet was obtained as same as the example 3 except for not using the intermediate layer, and carried out each evaluation. The results are shown in Table 1.

Comparative Example 2

The dicing sheet was obtained as same as the example 3 except for not using the intermediate layer and making the thickness of the pressure sensitive adhesive layer to 25 μm, and carried out each evaluation. The results are shown in Table 1.

Comparative Example 3

The dicing sheet was obtained as same as the example 1 except for using the intermediate layer composition as described in below, and carried out each evaluation. The results are shown in Table 1.
[The Production of the Intermediate Layer Composition]

100 parts by weight of the acrylic polymer (the weight average molecular weight: 850000) obtained by polymerizing butyl acrylate/acrylic acid=90/10 (weight ratio), 2 parts by weight of the crosslinking agent ((polyvalent isocyanate compound (CORONATE L made by NIPPON POLYURETHANE INDUSTRY Co., Ltd.) were mixed in the solvent thereby obtained the intermediate layer composition.

Comparative Example 4

The dicing sheet was obtained as same as the example 1 except for making the thickness of the intermediate layer to 20 μm and not using the pressure sensitive adhesive layer, and carried out each evaluation. The results are shown in Table 1.

Comparative Example 5

The dicing sheet was obtained as same as the example 3 except for making the thickness of the pressure sensitive adhesive layer to 5 μm, and carried out each evaluation. The results are shown in Table 1.

Comparative Example 6

The dicing sheet was obtained as same as the example 3 except for making the thickness of the pressure sensitive adhesive layer to 40 μm, and carried out each evaluation. The results are shown in Table 1.

TABLE 1

| | The intermediate layer | | The pressure sensitive adhesive layer | | | | | | The adhesive layer residue | |
|---|---|---|---|---|---|---|---|---|---|---|
| | The storage elasticity G' (Pa) | Thickness (μm) | The storage elasticity G' (Pa) | Thickness (μm) | The following property | The dicing property | The pickup property | The cylinder shape electrodes | The outer peripheral area of the cylinder shape electrode formed area |
| Example 1 | 6.5 × 10⁴ | 15 | 4.6 × 10⁵ | 10 | A | A | A | A | A |
| Example 2 | 6.5 × 10⁴ | 20 | 4.6 × 10⁵ | 10 | A | A | A | A | A |
| Example 3 | 6.5 × 10⁴ | 15 | 4.6 × 10⁵ | 10 | A | A | A | A | A |
| Example 4 | 6.5 × 10⁴ | 15 | 4.6 × 10⁵ | 20 | A | A | A | A | A |
| Example 5 | 5.2 × 10⁴ | 20 | 4.6 × 10⁵ | 10 | A | A | A | A | A |
| Example 6 | 6.5 × 10⁴ | 15 | 3.8 × 10⁵ | 10 | A | A | A | A | A |
| Example 7 | 6.5 × 10⁴ | 15 | 3.8 × 10⁵ | 15 | A | A | A | A | A |
| Example 8 | 4.6 × 10⁴ | 15 | 4.6 × 10⁵ | 10 | A | A | A | A | A |
| Example 9 | 5.2 × 10⁴ | 25 | 4.6 × 10⁵ | 10 | A | B | A | A | A |
| Example 10 | 5.2 × 10⁴ | 10 | 4.6 × 10⁵ | 10 | A | A | A | A | B |
| Comparative example 1 | — | — | 4.6 × 10⁵ | 10 | A | A | A | A | C |
| Comparative example 2 | — | — | 4.6 × 10⁵ | 25 | A | A | A | A | C |
| Comparative example 3 | 1.8 × 10⁵ | 15 | 4.6 × 10⁵ | 10 | A | A | A | A | C |
| Comparative example 4 | 6.5 × 10⁴ | 20 | — | — | B | C | B | C | A |
| Comparative example 5 | 6.5 × 10⁴ | 15 | 4.6 × 10⁵ | 5 | B | A | B | C | A |
| Comparative example 6 | 6.5 × 10⁴ | 15 | 4.6 × 10⁵ | 40 | A | B | A | A | C |

In the dicing sheet of the example 9, the intermediate layer had a thickness of 1.67 times of the height of the cylinder shape electrode, thus the chipping of more than 30 μm and 50 μm or less took place; however it was a level which does not cause any problem in practical use. Also, in the dicing sheet of the example 10, the intermediate layer had a thickness of 0.67 times of the height of the cylinder shape electrode, thus the following property of the dicing sheet at the outer peripheral of the electrode formed area declined and a slight adhesive residue occurred; however it was a level which does not cause any problem in practical use.

The dicing sheet of the comparative examples 1 and 2 did not have the intermediate layer, thus the following property of the dicing sheet at the outer peripheral part of the electrode formed area was low, and caused the adhesive residue. Also in the dicing sheet of the comparative example 3, the difference between the storage elasticity G' at 23° C. of the intermediate layer and the storage elasticity G' at 23° C. of the pressure sensitive adhesive layer before curing is small, thus the following property of the dicing sheet at the outer peripheral part of the electrode formed area was low, and caused the pressure sensitive adhesive layer residue. Also, in the dicing sheet of the comparative examples 4 and 5, the following property at the outer peripheral part of the electrode formed area and between the cylinder shape electrodes were good, thus the adhesive residue were found in between the electrodes and was unable to pickup. Particularly, in the dicing sheet of the comparative example 4, the pressure sensitive adhesive layer was not provided and the storage elasticity G' of the intermediate layer was low, thus the intermediate layer entered between the cylinder shape electrodes and caused the pressure sensitive adhesive layer residue, furthermore it was unable to pickup. Also since the storage elasticity G' of the intermediate is low (in this example, it directly contact with the semiconductor wafer and also function as the pressure sensitive adhesive layer), the chipping of 50 μm or larger took place during the dicing. In the dicing sheet of the comparative example 6, as the pressure sensitive adhesive layer was too thick, the following property of the dicing sheet at the outer peripheral of the electrode formed area formed by stacking the intermediate layer and the pressure sensitive adhesive layer was insufficient, and caused the pressure sensitive adhesive layer residue.

REFERENCES OF THE NUMERALS

10: Dicing sheet
1: Pressure sensitive adhesive layer
2: Intermediate layer
3: Base
20: (20a to 20i): Cylinder shape electrode
30: Semiconductor wafer

The invention claimed is:

1. A dicing sheet comprising:
    a base,
    an intermediate layer on one face of said base, and
    an pressure sensitive adhesive layer provided on the intermediate layer and having the thickness of 8 to 30 μm,
    wherein the pressure sensitive adhesive layer comprises a compound having an energy ray curable double bond in a molecule, and a storage elasticity G' at 23° C. of the pressure sensitive adhesive layer before curing is larger than 4 times of a storage elasticity at 23° C. of the intermediate layer, and
    when the dicing sheet is laminated via the pressure sensitive adhesive layer on a wafer formed with a cylinder shape electrodes having a height of 15 μm and a diameter of 15 μm at a pitch of 40 μm having 3 rows 3 columns in equal spacing, at a center of the electrode of the cylinder shape electrodes formed in 3 rows 3 columns, the pressure sensitive adhesive layer does not contact at a part of a height of 7.5 μm or less of the electrode.

2. The dicing sheet as set forth in claim 1 wherein said compound having the energy ray curable double bond in the molecule includes an energy ray curable adhesive polymer having an energy ray polymerizable group bonding at a main chain or a side chain of the polymer.

3. The dicing sheet as set forth in claim 1 wherein the storage elasticity at 23° C. of the intermediate layer is $10^4$ Pa or more and less than 105 Pa.

4. The dicing sheet as set forth in claim 1 wherein the storage elasticity G' at 23° C. of the pressure sensitive adhesive layer before curing is $3 \times 10^5$ Pa or more.

5. The dicing sheet as set forth in claim 1 wherein said adhesive layer comprises an acrylic polymer having a reactive functional group and a crosslinking agent, and comprises 5 parts by weight or more of said crosslinking agent with respect to 100 parts by weight of said acrylic polymer.

6. The dicing sheet as set forth in claim 5 wherein said crosslinking agent is an isocyanate crosslinking agent.

7. The dicing sheet as set forth in claim 1 wherein said dicing layer is laminated to the wafer provided with projection like electrodes.

8. The dicing sheet as set forth in claim 7 wherein said projection like electrodes are through-silicon vias.

9. The dicing sheet as set forth in claim 7 wherein the intermediate layer has a thickness of 0.5 to 1.5 times of a height of the projection like electrodes.

10. A production method of a semiconductor chip comprising steps of:
    laminating a dicing sheet as set forth in claim 1 to a face formed with electrodes of a semiconductor wafer having a projection like electrodes,
    making a semiconductor chip by separating said semiconductor wafer into each circuit, and
    picking up said semiconductor chip.

11. The dicing sheet as set forth in claim 1 wherein the pressure sensitive adhesive layer does not follow between the electrodes.

12. The dicing sheet as set forth in claim 11 wherein the pressure sensitive adhesive layer follows an outer peripheral part of an area where the electrodes are formed.

* * * * *